(12) United States Patent
Cheng et al.

(10) Patent No.: US 10,923,507 B2
(45) Date of Patent: Feb. 16, 2021

(54) ARRAY SUBSTRATE WITH IMPROVEMENT READING SPEED, DRIVING METHOD AND DISPLAY DEVICE

(71) Applicant: BOE TECHNOLOGY GROUP CO., LTD., Beijing (CN)

(72) Inventors: Chih Jen Cheng, Beijing (CN); Pengpeng Wang, Beijing (CN); Wei Liu, Beijing (CN); Xueyou Cao, Beijing (CN); Yanling Han, Beijing (CN); Ping Zhang, Beijing (CN); Xiaoliang Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 42 days.

(21) Appl. No.: 16/218,793

(22) Filed: Dec. 13, 2018

(65) Prior Publication Data

US 2019/0237480 A1     Aug. 1, 2019

(30) Foreign Application Priority Data

Jan. 31, 2018     (CN) .......................... 2018 1 0098206

(51) Int. Cl.
*G09G 3/32*     (2016.01)
*H01L 27/12*     (2006.01)

(52) U.S. Cl.
CPC ............. *H01L 27/124* (2013.01); *G09G 3/32* (2013.01); *G09G 2300/0426* (2013.01); *G09G 2300/0439* (2013.01); *G09G 2310/0294* (2013.01)

(58) Field of Classification Search
None
See application file for complete search history.

(56) References Cited

U.S. PATENT DOCUMENTS

| 2003/0151569 | A1* | 8/2003 | Lee | G09G 3/3233 345/84 |
| 2005/0264665 | A1* | 12/2005 | Endo | H04N 5/3698 348/308 |
| 2006/0007215 | A1* | 1/2006 | Tobita | G09G 3/3291 345/204 |
| 2006/0226800 | A1* | 10/2006 | Bruning | G02F 1/1336 318/280 |

* cited by examiner

*Primary Examiner* — Amr A Awad
*Assistant Examiner* — Donna V Lui
(74) *Attorney, Agent, or Firm* — Calfee, Halter & Griswold LLP

(57) ABSTRACT

An array substrate includes: a plurality of pixel units arranged in an array, selection lines, a reset circuit and readout circuits. Second terminals of transistors in pixel units belonging to a same column are connected to at least two of the read lines, so that a part of the pixel units are connected to a same read line, and another part of the pixel units are connected to the other one of the at least two of the read lines. For each column of the pixel units, each of the read lines is connected to one of the readout circuits corresponding to the column of the pixel units through a switching element; and for each column of the pixel units, each of the read lines is connected to the reset circuit through a switching element.

12 Claims, 4 Drawing Sheets

ARRAY SUBSTRATE WITH IMPROVEMENT READING SPEED, DRIVING METHOD AND DISPLAY DEVICE

CROSS REFERENCE

The present application claims the priority of Chinese Patent Application No. 201810098206.0, filed on Jan. 31, 2018, and the entire contents thereof are incorporated herein by reference as part of the present application.

TECHNICAL FIELD

The present disclosure relates to display technologies, and in particular, to an array substrate, a method for driving the array substrate, and a display device.

BACKGROUND

With the development of optical technologies and semiconductor technologies, flat panel displays, represented by liquid crystal displays (LCDs) and organic light emitting diodes (OLEDs), have the characteristics of light weight and thin size, low energy consumption, fast response, high color purity and high contrast ratio, and the like, and thus have dominated the display field.

At present, a pixel detecting circuit is disposed in array substrates. The position of the pixel detecting circuit in an array substrate can be determined according to specific needs. The pixel detecting circuit may be a passive pixel detecting circuit with a photodiode, which can be applied to optical detection, such as X-ray (X-ray computer tomography) light receiving terminal, optical fingerprint recognition, and the like. The pixel detecting circuit includes a readout circuit that can acquire signals of pixel units by reading signals of the pixel units in the array substrate. The process of reading out the signals of the pixel units may be as follows. At first, pixel units are sequentially reset by the read lines, and after each pixel unit is reset sequentially, each pixel unit sequentially enters an integration stage. It should be noted that, the integration time of the integration phases of the pixel units are the same, but the timing at which each pixel unit enters the integration phase is different. After the first pixel unit completes the integration phase, the readout circuit begins to sequentially read the signals of the respective pixel units through the read lines.

It should be noted that the information discussed above and herein is only for enhancing the understanding of the background of the present disclosure, and thus may include information that does not constitute prior art known to those of ordinary skill in the art.

SUMMARY

According to an aspect of the present disclosure, there is provided an array substrate, including:
a plurality of transistors;
a plurality of pixel units arranged in an array, each of the pixel units including one of the transistors and a light emitting element connected to a first terminal of the one of the transistors;
selection lines each of which corresponds to each row of the pixel units one to one, wherein a control terminal of each of the transistors is connected to a corresponding one of the selection lines;
read lines each of which is connected to a second terminal of a corresponding one of the transistors, wherein one of the transistors is connected to one of the read lines;
wherein second terminals of transistors in pixel units belonging to a same column are connected to at least two of the read lines, so that a part of the pixel units are connected to one of the at least two of the read lines, and another part of the pixel units are connected to the other of the at least two of the read lines;
wherein the array substrate further includes:
a reset circuit; and
readout circuits each of which corresponds to a corresponding column of the pixel units one to one;
wherein for each column of the pixel units, each of the read lines is connected to one of the readout circuits corresponding to the column of the pixel units through a switching element; and
wherein for each column of the pixel units, each of the read lines is connected to the reset circuit through a switching element.

According to an exemplary embodiment of the present disclosure, second terminals of transistors in pixel units belonging to a same column are connected to two of the read lines which includes a first read line and a second read line, such that a part of the pixel units are connected to the first read line, and another part of the pixel units are connected to the second read line.

According to an exemplary embodiment of the present disclosure, transistors in odd rows of the pixel units belonging to the same column of the pixel units are connected to the first read line, and transistors in even rows of the pixel units belonging to the same column of the pixel units are connected to the second read line.

According to an exemplary embodiment of the present disclosure, transistors in first M rows of the pixel units belonging to the same column of the pixel units are connected to the first read line, and transistors in last P rows of the pixel units belonging to the same column of the pixel units are connected to the second read line, and M and P are integers.

According to an exemplary embodiment of the present disclosure, the switching element is a single-pole multi-throw switch.

According to an exemplary embodiment of the present disclosure, the switching element includes a plurality of first switching elements and one second switching element, individual one of the read lines corresponding to individual one of columns of the pixel units is connected to one of the readout circuits corresponding to the one of columns of the pixel units through a corresponding one of the first switching elements, and the individual one of the read lines corresponding to individual one of columns of the pixel units is connected to the reset circuit through the second switching element;
wherein the array substrate further includes a control circuit connected to the plurality of the first switching elements and the second switching element and configured to control the first switching elements and the second switching element to be switched between a plurality of the read lines connected to the pixel units belonging to the same column of the pixel units.

According to an exemplary embodiment of the present disclosure, the reset circuit includes a buffer; a first terminal of the buffer receives a reset signal, a second terminal of the buffer is connected to a third terminal of the buffer, the third terminal of the buffer is connected to the read lines through the switching element.

According to an exemplary embodiment of the present disclosure, each of the readout circuits includes an operational amplifier and a capacitor, a first terminal of the operational amplifier receives a common mode signal, a second terminal of the operational amplifier is connected to a corresponding switching element, a first terminal of the capacitor is connected to a third terminal of the operational amplifier, and a second terminal of the capacitor is connected to the second terminal of the operational amplifier.

According to an exemplary embodiment of the present disclosure, the array substrate further includes:

a data selector configured to enable the third terminal of the operational amplifier in one of the readout circuits to be connected to a sample and hold circuit, wherein the sample and hold circuit is configured to sample a signal at the third terminal of the operational amplifier in the one of the readout circuits; and an analog-to-digital converter connected to the sample and hold circuit and configured to convert the sampled signal at the third terminal of the operational amplifier in the one of the readout circuits into a digital signal.

According to another aspect of the present disclosure, there is provided a display device, including the array substrate as described above.

According to another aspect of the present disclosure, there is provided an array substrate driving method, for driving the array substrate as described above, wherein the method includes:

in a first stage, connecting the reset circuit to one of the at least two of the read lines connected to each column of the pixel units through the switching element, and connecting a corresponding one of the readout circuits to the other one of the at least two of the read lines connected to each column of the pixel units, such that a part of the pixel units are connected to the reset circuit, another part of the pixel units are connected to the corresponding one of the readout circuits, the part of the pixel units are reset by the reset circuit, and signals of the another part of the pixel units are read by the corresponding one of the readout circuits; and in a second stage, connecting the reset circuit to the other one of the at least two of the read lines connected to each column of the pixel units through the switching element, and connecting the corresponding one of the readout circuits to the one of the at least two of the read lines connected to each column of the pixel units, such that the another part of the pixel units are connected to the reset circuit, the part of the pixel units are connected to the corresponding one of the readout circuits, the another part of the pixel units are reset by the reset circuit, and signals of the part of the pixel units are read by the corresponding one of the readout circuits.

According to an exemplary embodiment of the present disclosure, second terminals of transistors in pixel units belonging to a same column are connected to two of the read lines which includes a first read line and a second read line, such that a part of the pixel units are connected to the first read line, and another part of the pixel units are connected to the second read line;

wherein the method includes:

in the first stage, connecting the reset circuit to the first read line connected to each column of the pixel units through the switching element, and connecting the corresponding one of the readout circuits to the second read line connected to each column of the pixel units, such that a part of the pixel units are connected to the reset circuit, another part of the pixel units are connected to the corresponding one of the readout circuits, the part of the pixel units are reset by the reset circuit, and signals of the another part of the pixel units are read by the corresponding one of the readout circuits; and in the second stage, connecting the reset circuit to the second read line connected to each column of the pixel units through the switching element, and connecting the corresponding one of the readout circuits to the first read line connected to each column of the pixel units, such that the another part of the pixel units are connected to the reset circuit, the part of the pixel units are connected to the corresponding one of the readout circuits, the another part of the pixel units are reset by the reset circuit, and signals of the part of the pixel units are read by the corresponding one of the readout circuits.

According to an exemplary embodiment of the present disclosure, the part of the pixel units are odd rows of the pixel units belonging to the same column of the pixel units, and the another part of the pixel units are even rows of the pixel units belonging to the same column of the pixel units.

According to an exemplary embodiment of the present disclosure, a part of the pixel units are first M rows of the pixel units belonging to the same column of the pixel units, and the another part of the pixel units are last P rows of the pixel units belonging to the same column of the pixel units, and M and P are integers.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

DETAILED DESCRIPTION

Figure 1:
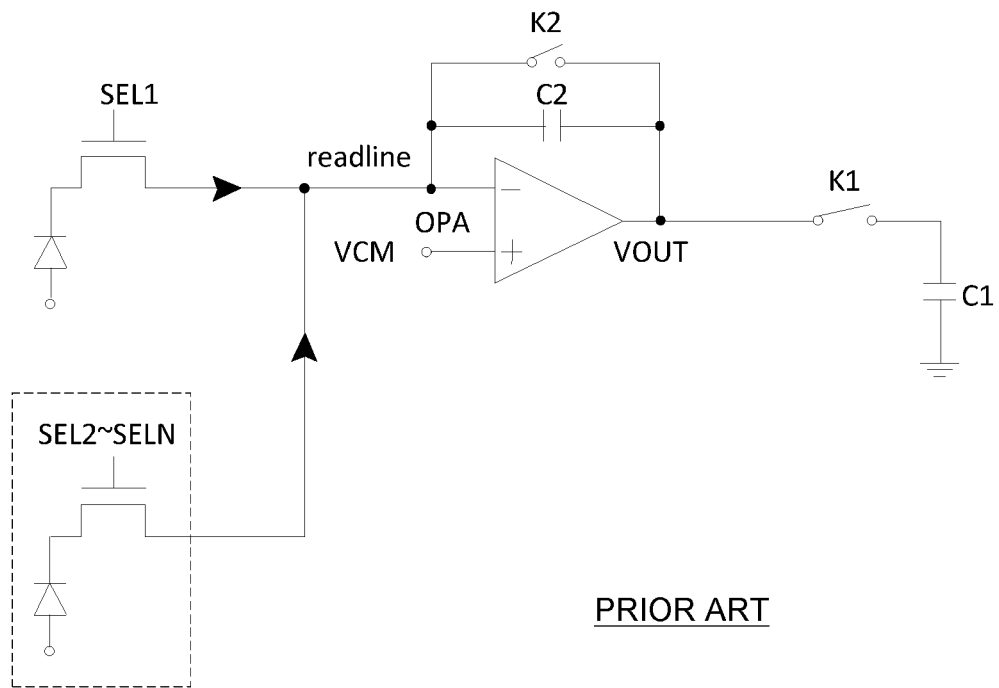
FIG. 1 is a schematic diagram of an array substrate in a related art.

Example embodiments will now be described more fully with reference to the accompanying drawings. However, the embodiments can be implemented in a variety of forms and should not be construed as being limited to the examples set forth herein; rather, these embodiments are provided so that this disclosure will be more complete so as to convey the idea of the exemplary embodiments to those skilled in this art. The described features, structures, or characteristics in one or more embodiments may be combined in any suitable manner. In the following description, numerous specific details are set forth to provide a full understanding of the embodiments of the present disclosure. However, one skilled in the art will appreciate that the technical solutions of the present disclosure can be practiced when one or more of the described specific details may be omitted or other methods, components, devices, steps, etc. may be employed. In other cases, well-known technical solutions are not shown or described in detail to avoid obscuring aspects of the present disclosure.

In addition, the drawings are merely schematic illustrations of the present disclosure, and are not necessarily drawn to scale. The same or similar parts in the drawings will be denoted with the same reference numerals, and repeated descriptions thereof will be omitted.

In the related art, when the integration time is relatively short, there are pixel units that have not been reset after the first pixel unit completes the integration phase. At this time, if the reading of the signals of the pixel units is started, it is necessary to stop the reset operation of the pixel units which have not been reset, and start resetting the pixel units that have not been reset after reading the signals of all the pixel units that have completed the integration stage, which limiting the reading speed of the readout circuit, thereby reducing the efficiency of the array substrate.

FIG. 1 shows an array substrate in a related art. In FIG. 1, the array substrate includes N pixel units arranged in a row, a read line, a readout circuit, a sample and hold circuit, and an analog to digital converter. Each pixel unit includes a transistor and a light emitting element. A first terminal of the transistor is connected to the light emitting element, a control terminal of the transistor receives a scan signal provided by the selection line, and a second terminal of the transistor is connected to one terminal of the read line. The readout circuit includes an operational amplifier OPA, a second capacitor C2, and a second switching element K2. The negative phase input terminal of the operational amplifier OPA is connected to the other terminal of the read line, and the positive input terminal of the operational amplifier OPA receives a common mode signal VCM. Two terminals of the second capacitor C2 are connected to the negative phase input terminal and the output terminal Vout of the operational amplifier OPA, two terminals of the switching element K2 are connected to the two terminals of the second capacitor C2, and the second switching element K2 is controlled by a reset control signal RST. The sample and hold circuit includes a first switching element K1 and a first capacitor C1. One terminal of the first switching element K1 is connected to the output terminal Vout of the operational amplifier OPA, and a second terminal of the first switching element K1 is connected to the capacitor C1. The first switching element K1 is controlled by the sampling control signal SH. An analog to digital converter (not shown in FIG. 1) is coupled to the sample and hold circuit.

Figure 2:
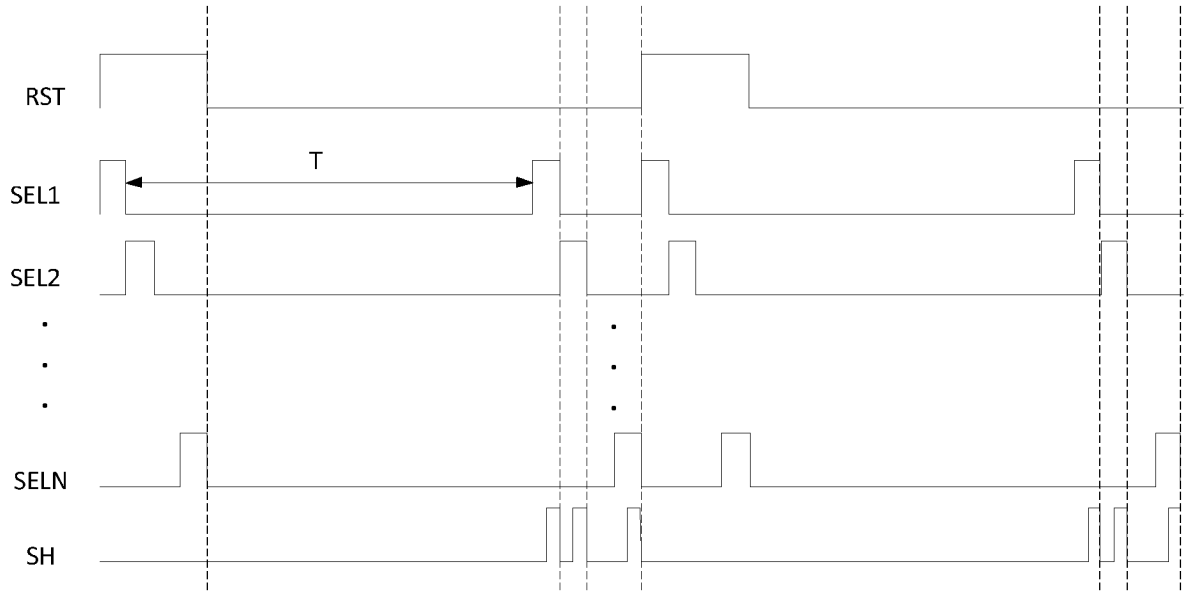
FIG. 2 is a schematic diagram showing operation timing (or time sequences) of an array substrate in a related art.

The operation principle of the array substrate in FIG. 1 will be described in detail below with reference to the operation timing of the array substrate shown in FIG. 2. In the following descriptions, for example, all the transistors are N-type transistors.

First, the reset control signal RST is at a high level, the second switching element K2 is turned on, the voltage of the read line is reset to the common mode signal VCM. At the same time, during the high level of the reset control signal RST, the scan signals SEL1~SELN sequentially jump to a high level to control the transistors in the first to N-th pixel unit to be turned on sequentially, thereby sequentially reset the light-emitting elements in the first to N-th pixel unit, that is, resetting the potential of the light-emitting elements in pixel units to the common mode signal VCM. After the scan signals SEL1~SELN sequentially jump to the low level, the light-emitting elements in pixel units sequentially start light integration, that is, enter the integration phase. Next, after the scan signals SEL1~SELN sequentially jump to the high level, the first to N-th pixel units sequentially transmit the signals in the light-emitting elements in the pixel units to the output terminal Vout of the readout circuit through the read line. At the same time, the sampling control signal SH jumps to a high level according to a preset frequency to control the first switching element K1 to be turned on according to a frequency, so that the sample and hold circuit sequentially samples the signals transmitted from the pixel units to the output terminal Vout, and the sampled signals of pixel units are sequentially converted into digital signals by an analog-to-digital converter. Then, the entire reading process is completed.

In the above process, the period between resetting of each pixel unit and outputting of signal from each pixel unit (i.e., the period T in FIG. 2) is the integration time. A sequence diagram with a long integration time is shown in FIG. 2. But, in the case where the integration time of each pixel unit is relatively short, the readout circuit needs to read the signal of the first pixel unit when the (N/2+1)-th pixel unit is reset. Thus, if the action of reading the signal of the first pixel unit is to be performed, the operation of resetting the (N/2+1)-th pixel unit needs to be stopped, and the (N/2+1)-th pixel unit cannot be reset until reading of the signal from the first to (N/2)-th pixel units are read sequentially. Thus, the read speed of the readout circuit is limited, thereby reducing the efficiency of the array substrate.

In order to ensure the reading speed in the case of a short integration time, an array substrate is provided in an exemplary embodiment. The array substrate may include:

a plurality of pixel units arranged in an array, each of the pixel units including a transistor and a light emitting element connected to a first terminal of the transistor;

selection lines each of which corresponds to each row of the pixel units one to one, wherein a control terminal of the transistor is connected to a corresponding one of the selection lines;

read lines connected to a second terminal of the transistor, wherein one of the transistors is connected to one of the read lines.

Second terminals of transistors in pixel units belonging to a same column are connected to at least two of the read lines, so that a part of the pixel units are connected to a same read line, and another part of the pixel units are connected to the other one of the at least two of the read lines.

The array substrate may further include: a reset circuit and readout circuits each of which corresponds to a corresponding column of the pixel units one to one.

For each column of the pixel units, each of the read lines is connected to one of the readout circuits corresponding to the column of the pixel units through a switching element.

For each column of the pixel units, each of the read lines is connected to the reset circuit through a switching element.

In the present exemplary embodiment, the light emitting element may be, for example, an OLED or the like, which is not particularly limited in the exemplary embodiment. The transistor may be an N-type transistor or a P-type transistor, and the transistor may be a depletion transistor or an enhancement transistor, which is not particularly limited in this exemplary embodiment. The transistor may include a control terminal, a first terminal, and a second terminal, the control terminal may be a gate, the first terminal may be a source, and the second terminal may be a drain. Alternatively, the control terminal may be a gate, the first terminal may be a drain and the second terminal may be a source. The present disclosure does not impose specific limitations on this. The transistor may be turned on or off by a scan signal in the selection line. For example, when the transistor is an N-type transistor, if the scan signal in the selection line is at a high level, the transistor is turned on; if the scan signal in the selection line is at a low level, the transistor is turned off. Each of the read lines is configured to, in a state where the corresponding transistor is turned on, transmit a reset signal output by the reset circuit to the light emitting element in the corresponding pixel unit, or transmit the signal output from the light emitting element to the readout circuit so that the readout circuits read the signals of the light-emitting elements.

The transistors belonging to the same column of pixel units may be connected to, for example, two, or three, or four or more read lines, and so on, and the number is not particularly limited herein. For example, in the case where the transistors in the pixel units of the same column are connected to three read lines, a part of the pixel units in the column may be connected to the first read line, and another part of the pixel units are connected to the second read line, and the remaining part of the pixel unit are connected to the third read line. For example, when the first read line and the second read line in the column are connected to the readout circuit corresponding to the column of pixel units through the switching element, the third read line is connected to the reset circuit through a switching element. When the first read line and the second read line are connected to the reset circuit through the switching element, the third read line is connected to the readout circuit corresponding to the column of pixel units through a switching element. In the following descriptions, for example, transistors belonging to pixel units in the same column are connected to two read lines, that is, the second terminals of transistors in a part of the pixel units belonging to the same column of pixel units are connected to one of the two read lines, and second terminals of the transistor in the other part pixel units belonging to the same column of pixel units are connected to the other one of the two read lines. For the same column of pixel units, one read line is connected to the readout circuit corresponding to the column of pixel units by a switching element, and the other read line is connected to the reset circuit through a switching element; or, for the same column of pixel units, one read line is connected to the reset circuit through a switching element, and the other read line is connected to the readout circuit corresponding to the column of pixel units by a switching element. The switching element may be a single-pole multi-throw switch, and may also be composed of a plurality of single-pole single-throw switches, which is not particularly limited in this exemplary embodiment. Compared to a switching element composed of a plurality of single-pole single-throw switches, a single-pole multi-throw switch can save space and thereby reduce the area of the array substrate.

The array substrate as described above includes a plurality of pixel units arranged in an array, read lines, a reset circuit, and readout circuits. Second terminals of transistors in pixel units belonging to the same column are connected to at least two of the read lines, so that a part of the pixel units are connected to one of the read lines, and at least another part of the pixel units are connected to at least another one of the at least two of the read lines. For each column of the pixel units, each of the read lines is connected to one of the readout circuits corresponding to the column of the pixel units through a switching element. For each column of the pixel units, each of the read lines is connected to the reset circuit through a switching element. Compared with the prior art, at least one read line is added, and a part of the pixel units are connected to the newly added read line. During the operation of the array substrate, the reset circuit is connected to a part of pixel units through the switching elements, and the readout circuit(s) is(are) connected to at least another part of the pixel units; or, the reset circuit is connected to a part of the pixel units, and the readout circuit(s) is(are) connected to at least another part of the pixel units. In this way, a part of the pixel units can be read while at least another part of the pixel units can be reset, or a part of the pixel units can be reset while at least another part of the pixel units can be read. This greatly improves the reading speed of the readout circuits, thereby greatly improves the efficiency of the array substrate. Also, the reading speed is guaranteed in the case of a short integration time.

On the basis of the above, second terminals of transistors in pixel units belonging to the same column are connected to two of the read lines which includes a first read line and a second read line, such that a part of the pixel units are connected to the first read line, and another part of the pixel units are connected to the second read line. In the present exemplary embodiment, the manner in which the second terminals of the transistors in pixel units belonging to the same column are connected to the first read line and the second read line may include the following two modes.

Figure 3:
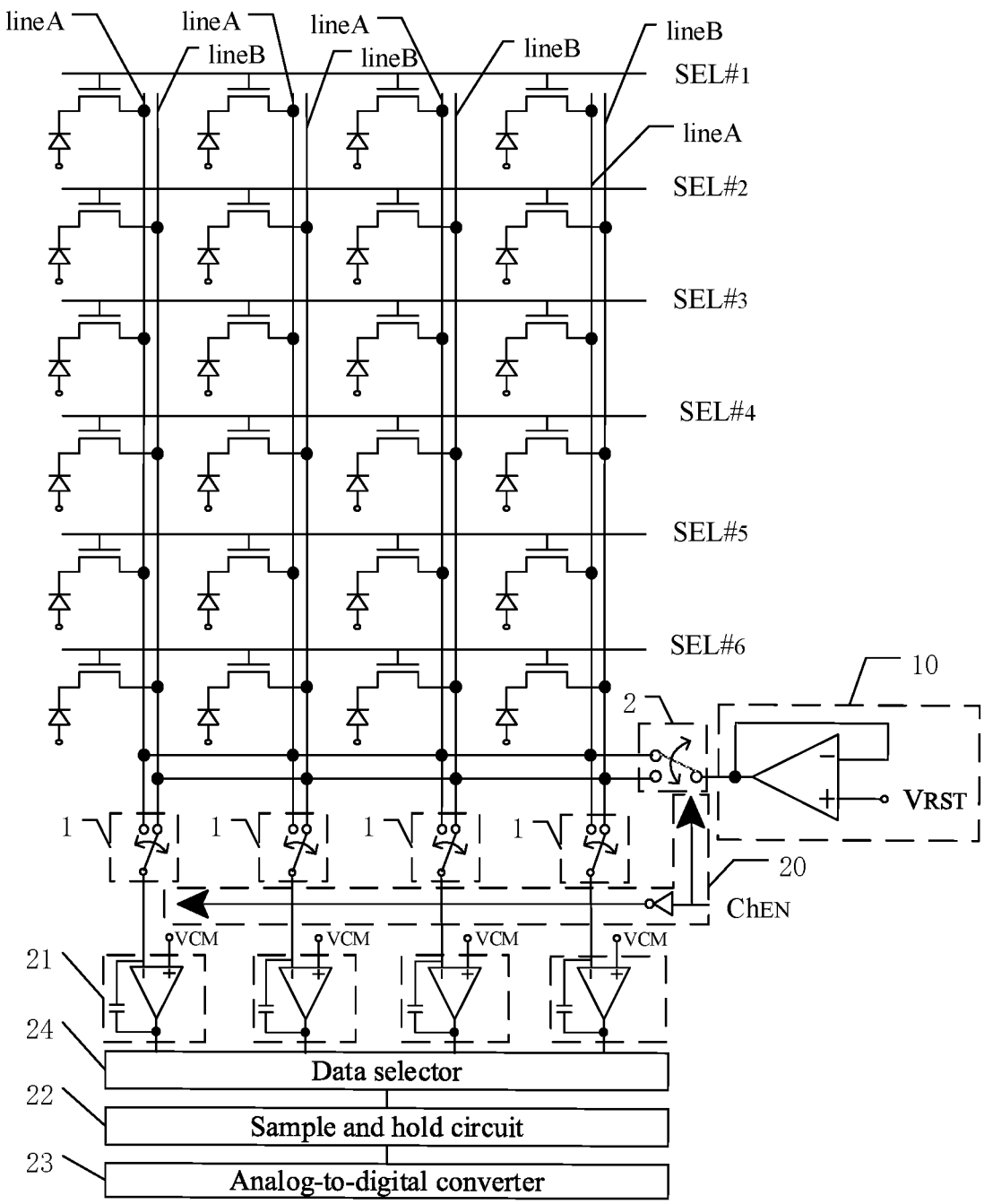
FIG. 3 is a schematic diagram of a pixel unit array arrangement according to an exemplary embodiment of the present disclosure.

In the first mode, transistors in odd rows of the pixel units belonging to the same column of the pixel units are connected to the first read line, and transistors in even rows of the pixel units belonging to the same column of the pixel units are connected to the second read line. For example, as shown in FIG. 3, the array substrate includes six rows and four columns of pixel units, the transistors in the odd-numbered rows of pixel units in each column of pixel units are connected to the first read line line-A, that is, the pixel units in the first, third, and fifth rows are connected to the first read line line-A; and the transistors in the pixel units of the even-numbered rows in each column of pixel units are connected to the second read line line-B, that is, the pixel unit in the second, fourth, and sixth rows are connected to the second read line line-B.

Figure 4:
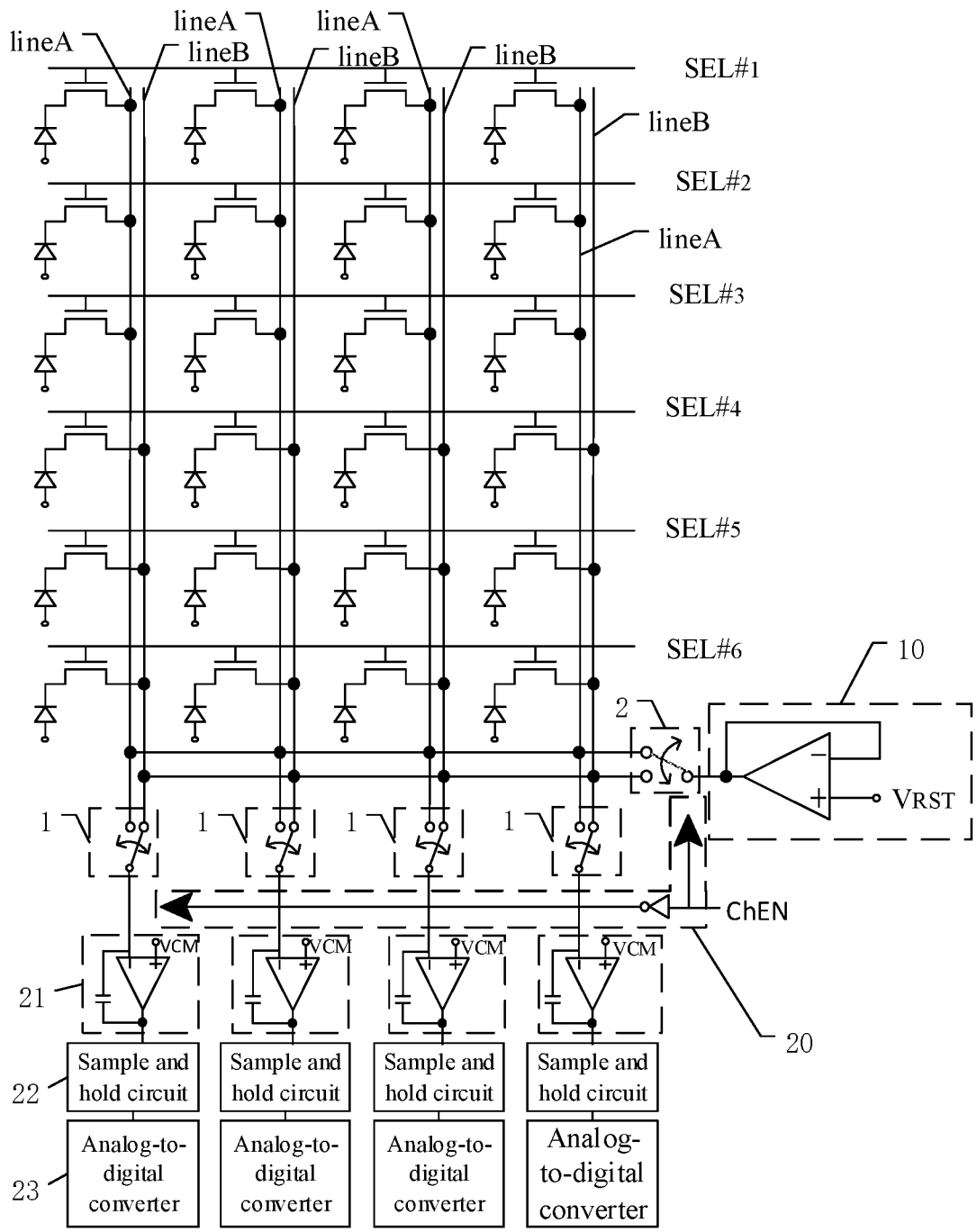
FIG. 4 is a schematic diagram of a pixel unit array arrangement according to an exemplary embodiment of the present disclosure.

In the second mode, transistors in first M rows of the pixel units belonging to the same column of the pixel units are connected to the first read line, and transistors in last P rows of the pixel units belonging to the same column of the pixel units are connected to the second read line, and M and P are integers. As shown in FIG. 4, the array substrate includes six rows and four columns of pixel units. The transistors in the first 3 rows of pixel units in each column of pixel units are connected to the first read line line-A, and the transistors in the last 3 rows of pixel units in each column of pixel units are connected to the second read line line-B. In this example, both M and P are equal to 3. It should be noted that M and P may be equal or not, and the exemplary embodiment does not specifically limit this.

The switching element may include a plurality of first switching elements and one second switching element. Individual one of the read lines corresponding to individual one of columns of the pixel units is connected to one of the readout circuits corresponding to the one of columns of the pixel units through a corresponding one of the first switching elements, and the individual one of the read lines corresponding to individual one of columns of the pixel units is connected to the reset circuit through the second switching element.

In the present exemplary embodiment, the number of the first switching elements is the same as the number of columns of pixel units in the array substrate. The first switching element and the second switching element are single-pole multi-throw switches, or are composed of a plurality of single-pole single-throw switches. The first switching elements and the second switching elements are in a reverse selection relationship. For example, as shown in FIG. 3, when the second terminals of the transistors in each column of pixel units are connected to two read lines, that is, each column of pixel units correspond to two read lines (i.e., the first read line line-A and the second read line line-B), the first read line line-A corresponding each column of pixel units is connected to the readout circuit 21 corresponding to each column of pixel units through the corresponding first switching element 1, and the second read line line-B corresponding to each column of pixel units is connected to the reset circuit 10 through the second switching element 2. Alternatively, the second read line line-B corresponding to each column of pixel units is connected to the read out circuit 21 corresponding to each column of pixel units through the corresponding first switching element 1, and the first read line line-A in each column of pixel units is connected to the reset circuit 10 through the second switching element 2.

On the basis of the above, the array substrate further includes a control circuit connected to the plurality of the first switching elements and the second switching element and configured to control the first switching elements and the second switching element to be switched between a plurality of the read lines connected to the pixel units belonging to the same column of the pixel units. For example, as shown in FIG. 3, if a column of pixel units includes two read lines (the first read line line-A and the second read line line-B), the control circuit 20 controls the first switching element 1 and the second switching element 2 to be switched between the first read line and the second read line in each column of pixel units. Specifically, when the control circuit 20 controls the first switching element 1 to be connected to the first read line line-A in each column of pixel units, the second switching element 2 is controlled to be connected to the second read line line-B in each column of pixel units. Alternatively, when the control circuit 20 controls the first switching element 1 to be connected to the second read line line-B in each column of pixel units, the second switching element 2 is controlled to be connected to the first read line line-A in each column of pixel units. It should be noted that the control circuit is controlled by the control signal ChEN. The control signal ChEN is used to control the first switching element and the second switching element to be switched between a plurality of read lines corresponding to pixel units belonging to the same column.

The reset circuit may include a buffer. A first terminal of the buffer receives a reset signal, a second terminal of the buffer is connected to a third terminal of the buffer, and the third terminal of the buffer is connected to the read lines through the switching element. The buffer may be an operational amplifier, the first terminal may be a non-inverting input of the operational amplifier, the second terminal may be an inverting input of the operational amplifier, and the third terminal may be an output terminal of the operational amplifier terminal. For example, as shown in FIG. 3, when the switching element includes four first switching elements 1 and one second switching element 2, the reset circuit 10 includes a buffer. The buffer may be an operational amplifier, the first terminal of the buffer receives the reset signal VRST, and the second terminal of the buffer is connected to the third terminal, and the third terminal of the buffer is connected to one of the plurality of read lines corresponding to each column of pixel units through the second switching element 2. It should be noted that the reset signal VRST herein may be equal to the common mode signal VCM. Since the second terminal and the third terminal of the buffer are connected, a buffer pole having a gain of 1 is formed, which can completely output the reset signal to the third terminal, thereby avoiding the phenomenon that the load is too excessive to be pushed.

Each of the readout circuits includes an operational amplifier and a capacitor, a first terminal of the operational amplifier receives a common mode signal, a second terminal of the operational amplifier is connected to a corresponding switching element, a first terminal of the capacitor is connected to a third terminal of the operational amplifier, and a second terminal of the capacitor is connected to the second terminal of the operational amplifier. For example, as shown in FIG. 3, when the switching element includes four first switching elements 1 and a second switching element 2, one of the readout circuits 21 includes an amplifier and a capacitor. The first terminal of the operational amplifier receives the common mode signal VCM, the second terminal of the operational amplifier is connected to a corresponding first switching element 1. The first terminal of the capacitor is connected to the third terminal of the operational amplifier, and the second terminal of the capacitor is connected to the second terminal of the operational amplifier. The first terminal of the operational amplifier may be a non-inverting input, the second terminal of the operational amplifier may be an inverting input, and the third terminal of the operational amplifier may be an output terminal, which is not particularly limited in the exemplary embodiment. The common mode signal VCM is used to provide a bias signal to the read line when the readout circuit reads the signal in each pixel unit through the read line.

On the basis of the above, as shown in FIG. 3, the array substrate may further include: a data selector 24, a sample and hold circuit 22, and an analog-to-digital converter 23.

The data selector 24 is configured to make the third terminal of the operational amplifier in one of the readout circuits 21 to be connected to the sample and hold circuit 22, that is, one terminal of the data selector 24 is switched among the third terminals of the operational amplifiers in the readout circuits 21. For example, data selector can be a multiplexer.

The sample and hold circuit 22 is configured to sample a signal at the third terminal of the operational amplifier in the one of the readout circuits. The sample and hold circuit 22 includes a capacitor connected to the data selector 24.

The analog-to-digital converter 23 is connected to the sample and hold circuit 22, and is configured to convert the sampled signal at the third terminal of the operational amplifier in the one of the readout circuits 21 into a digital signal.

In other exemplary embodiments of the present disclosure, as shown in FIG. 4, the array substrate may further include: sample and hold circuits 22 corresponding to the readout circuits 21 one to one, and analog-digital converters 23 corresponding to the sample and hold circuits 22 one to one. The sample and hold circuits 22 are configured to collect signals of the third terminals of the operational amplifiers in the corresponding readout circuits 21. Each sample and hold circuit includes a switch and a capacitor, one terminal of the switch is connected to the third terminal of the operational amplifier in the corresponding readout circuit 21, and the other terminal of the switch is connected to the capacitor. Each analog-to-digital converter 23 is connected to a corresponding sample and hold circuit 22 for converting a signal of the third terminal of the operational amplifier in the corresponding readout circuit 21 into a digital signal.

In an exemplary embodiment of the present disclosure, there is also provided a display device including any of the array substrates as described above.

In an exemplary embodiment of the present disclosure, there is also provided an array substrate driving method for driving the array substrate described above. The method can include the following steps.

In a first stage, the reset circuit is connected to one of the at least two of the read lines connected to each column of the pixel units through the switching element, and a corresponding one of the readout circuits is connected to the other one of the at least two of the read lines connected to each column of the pixel units, such that a part of the pixel units are connected to the reset circuit, another part of the pixel units are connected to the corresponding one of the readout circuits, the part of the pixel units are reset by the reset circuit, and signals of the another part of the pixel units are read by the corresponding one of the readout circuits.

In a second stage, the reset circuit is connected to the other one of the at least two of the read lines connected to each column of the pixel units through the switching element, and the corresponding one of the readout circuits is connected to the one of the at least two of the read lines connected to each column of the pixel units, such that the another part of the pixel units are connected to the reset circuit, the part of the pixel units are connected to the corresponding one of the readout circuits, the another part of the pixel units are reset by the reset circuit, and signals of the part of the pixel units are read by the corresponding one of the readout circuits.

When second terminals of transistors in pixel units belonging to a same column are connected to two of the read lines which includes a first read line and a second read line, such that a part of the pixel units are connected to the first read line, and another part of the pixel units are connected to the second read line, the method may include: in the first stage, connecting the reset circuit to the first read line connected to each column of the pixel units through the switching element, and connecting the corresponding one of the readout circuits to the second read line connected to each column of the pixel units, such that a part of the pixel units are connected to the reset circuit, another part of the pixel units are connected to the corresponding one of the readout circuits, the part of the pixel units are reset by the reset circuit, and signals of the another part of the pixel units are read by the corresponding one of the readout circuits; and in the second stage, connecting the reset circuit to the second read line connected to each column of the pixel units through the switching element, and connecting the corresponding one of the readout circuits to the first read line connected to each column of the pixel units, such that the another part of the pixel units are connected to the reset circuit, the part of the pixel units are connected to the corresponding one of the readout circuits, the another part of the pixel units are reset by the reset circuit, and signals of the part of the pixel units are read by the corresponding one of the readout circuits.

The part of the pixel units are odd rows of the pixel units belonging to the same column of the pixel units, and the another part of the pixel units are even rows of the pixel units belonging to the same column of the pixel units. Alternatively, the part of the pixel units are first M rows of the pixel units belonging to the same column of the pixel units, and the another part of the pixel units are last P rows of the pixel units belonging to the same column of the pixel units, and M and P are integers. The switching element may be a single-pole multi-throw switch or composed of a plurality of single-pole single-throw switches.

Hereinafter, the above process will be described by taking the array substrate in FIG. 3 as an example in conjunction with the working sequence diagram in FIG. 5. In FIG. 3, the array substrate includes six rows and four columns of pixel units, and each column of pixel units is connected to two read lines (the first read line line-A and the second read line line-B). Specifically, the pixel units of the odd rows in each column (i.e., the pixel units of the first, third, and fifth rows) are connected to the first read line line-A, and pixel units of the even rows in each column (i.e., the pixel units of the second, fourth, and sixth rows) are connected to the second read line line-B. The switching element includes four first switching elements 1 and one second switching element 2, each of the first switching elements 1 is connected to a corresponding readout circuit 21, and the second switching element 2 is connected to a reset circuit 10. The control terminals of the transistors in the pixel units in the first to sixth rows receive the first scan signals SEL #1 to sixth scan signal SEL #6, and the transistors in the pixel units are turned on under a high level.

In the first stage (i.e., the T1 stage), the first read line line-A in each column of pixel units is connected to the reset circuit 10 through the second switching element 2, and the second read line line-B in each column of the pixel unit is connected to the readout circuit 21 corresponding to each column of pixel units through the first switching element 1. When the first scan signal SEL #1, the third scan signal SEL #3, and the fifth scan signal SEL #5 sequentially jump to a high level, the reset circuit sequentially resets the pixel units of the first, third, and fifth rows in each column of pixel units through the first read line line-A, and after the pixel units of the first, third, and fifth rows in each column of pixel units are sequentially reset, the first scan signal SEL #1, the third scan signal SEL #3, and the fifth scan signal SEL #5 sequentially jump to a low level, and the first, third, and fifth rows of pixel units in each column of pixel units are sequentially turned off and enter the integration phase in turn. At the same time, the second scan signal SEL #2, the fourth scan signal SEL #4, and the sixth scan signal SEL #6 sequentially jump to a high level, and the readout circuits 21 read signals of the second, fourth, and sixth rows of pixel units of each column of pixel units through the corresponding second read line line-B, and after sequentially reading signals of the second, fourth, and sixth rows of pixel units of each column of pixel units, the second scan signal SEL #2, the fourth scan signal SEL #4 and the sixth scan signal SEL #6 sequentially jump to a low level.

In the second stage (i.e., the T2 stage), the second read line line-B in each column of pixel units is connected to the reset circuit 10 through the second switching element 2, and the first read line line-A in each column of pixel units is connected to the readout circuit 21 corresponding to each column of pixel units through the first switching element 1. After the first scan signal SEL #1, the third scan signal SEL #3, and the fifth scan signal SEL #5 sequentially jump to a high level, each readout circuit 21 sequentially reads the signals of the first, third, and fifth rows of pixel units in each column of pixel units through the corresponding first read line line-A. After the signals of the first, third, and fifth rows of pixel units in each column of pixel units are read, the first scan signal SEL #1, the third scan signal SEL #3, and the fifth scan signal SEL #5 sequentially jump to a low level. At the same time, the second scan signal SEL #2, the fourth scan signal SEL #4, and the sixth scan signal SEL #6 sequentially jump to a high level, and the reset circuit sequentially reset the second, fourth, and sixth rows pixel unit of each column of pixel units through the second read line line-B. After the second, fourth, and sixth rows pixel units of each column of pixel units are sequentially reset, the second scan signal SEL #2, the fourth scan signal SEL #4, and the sixth scan signal SEL #6 sequentially jump to a low level, and the second, fourth, and sixth rows pixel units of each column of pixel units are sequentially turned off, and sequentially enter an integration phase.

Figure 5:
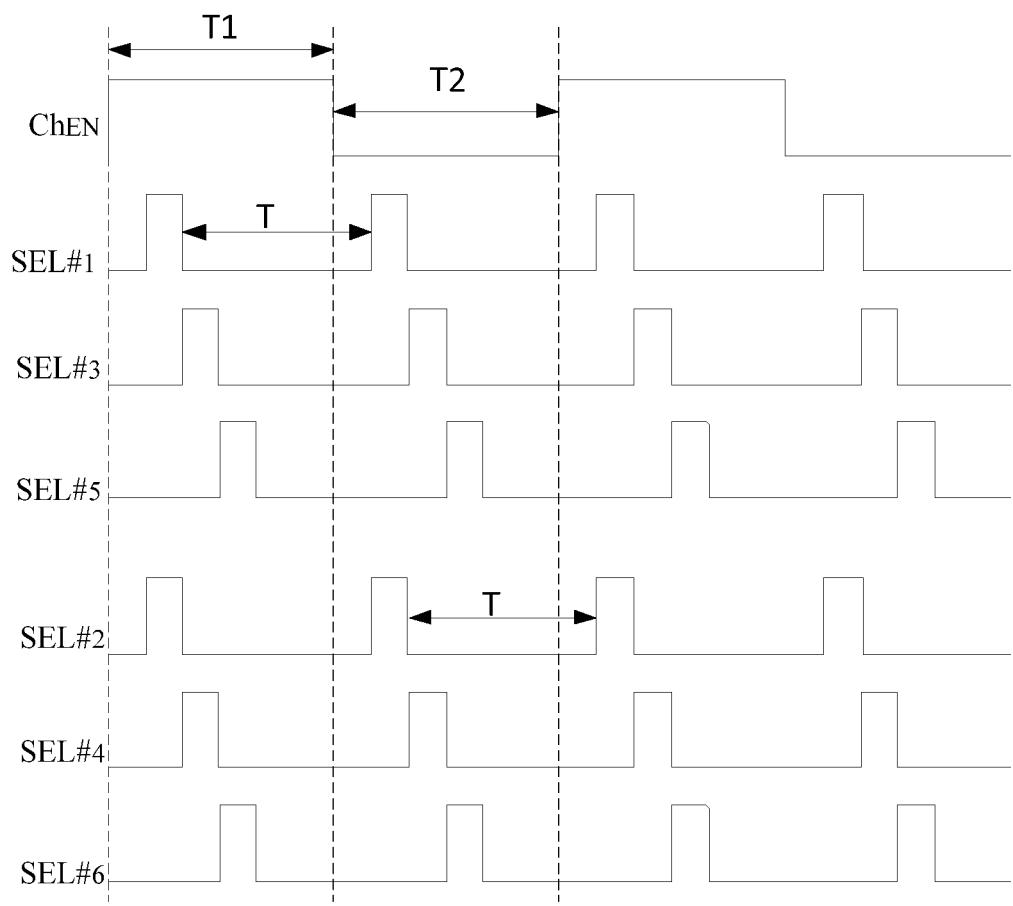
FIG. 5 is a schematic diagram showing operation timing (or time sequences) of an array substrate provided in an exemplary embodiment of the present disclosure.

It should be noted that the integration time is the period from the completion of the resetting of each pixel unit to the start of reading of the signal of each pixel unit (i.e., the T period in FIG. 5).

As can be seen from the above, during the operation of the array substrate, the reset circuit is connected to a part of the pixel units through the switching element, and the readout circuit(s) is(are) connected to at least another part of the pixel units; or, the reset circuit is connected to the at least another part of the pixels unit, and the readout circuit(s) is(are) connected to a part of the pixel unit, so that the at least another part of the pixel units can be read while the part of pixel units are reset, or the at least another part of the pixel units can be reset while the part of pixel units are read. That greatly improves the reading speed of the readout circuit(s), thereby greatly improving the efficiency of the array substrate, and also ensuring the reading speed in the case of a short integration time.

It should be noted that although modules or units of devices for executing functions are described above, such division of modules or units is not mandatory. In fact, features and functions of two or more of the modules or units described above may be embodied in one module or unit in accordance with the embodiments of the present disclosure. Alternatively, the features and functions of one module or unit described above may be further divided into multiple modules or units.

In addition, although various steps of the method of the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on.

Other embodiments of the present disclosure will be apparent to those skilled in the art. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. An array substrate, comprising:
a plurality of transistors;
a plurality of pixel units, arranged in an array, and each comprising one of the transistors and a light emitting element connected to a first terminal of the one of the transistors;
selection lines, each corresponding to each row of the pixel units one to one, wherein a control terminal of each of the transistors is connected to a corresponding one of the selection lines;
read lines, each connected to a second terminal of a corresponding one of the transistors, wherein one of the transistors is connected to one of the read lines;
wherein second terminals of transistors in pixel units belonging to a same column are connected to at least two of the read lines, so that a part of the pixel units are connected to one of the at least two of the read lines, and another part of the pixel units are connected to the other of the at least two of the read lines;
wherein the array substrate further comprises:
a reset circuit; and
readout circuits, each corresponding to a corresponding column of the pixel units one to one;
wherein for each column of the pixel units, each of the read lines is connected to one of the readout circuits corresponding to the column of the pixel units through at least one switching element; and
wherein for each column of the pixel units, each of the read lines is connected to the reset circuit through the at least one switching element,
wherein each of the readout circuits comprises an operational amplifier and capacitor, wherein a first terminal operational amplifier receives a common mode signal, a second terminal of the operation amplifier is connected to a corresponding switching element, a first terminal of the capacitor is connected to a third terminal of the operational amplifier, and a second terminal of the capacitor is connected to the second terminal of the operation amplifier,
wherein the array substrate further comprises,
a data selector, configured to enable the third terminal of the operational amplifier in one of the readout circuits to be connected to a sample and hold circuit, wherein the sample and hold circuit is configured to sample a signal at the third terminal of the operation amplifier in the one of the readout circuits; and
an analog-to-digital converter, connected to the sample and hold circuit and configured to convert the sampled signal at the third terminal of the operation amplifier in the one of the readout circuits into a digital signal.

2. The array substrate according to claim 1, wherein second terminals of transistors in pixel units belonging to a same column are connected to two of the read lines which comprises a first read line and a second read line, such that a part of the pixel units are connected to the first read line, and another part of the pixel units are connected to the second read line.

3. The array substrate according to claim 2, wherein transistors in odd rows of the pixel units belonging to the same column of the pixel units are connected to the first read line, and transistors in even rows of the pixel units belonging to the same column of the pixel units are connected to the second read line.

4. The array substrate according to claim 2, wherein transistors in first M rows of the pixel units belonging to the same column of the pixel units are connected to the first read line, and transistors in last P rows of the pixel units belonging to the same column of the pixel units are connected to the second read line, and M and P are integers.

5. The array substrate according to claim 1, wherein the at least one switching element is a single-pole multi-throw switch.

6. The array substrate according to claim 1, wherein the at least one switching element comprises a plurality of first switching elements and one second switching element, individual one of the read lines corresponding to individual one of columns of the pixel units is connected to one of the readout circuits corresponding to the one of columns of the pixel units through a corresponding one of the first switching elements, and the individual one of the read lines corresponding to individual one of columns of the pixel units is connected to the reset circuit through the second switching element;

wherein the array substrate further comprises a control circuit connected to the plurality of the first switching elements and the second switching element and configured to control the first switching elements and the second switching element to be switched between a plurality of the read lines connected to the pixel units belonging to the same column of the pixel units.

7. The array substrate according to claim 1, wherein the reset circuit comprises a buffer; wherein a first terminal of the buffer receives a reset signal, a second terminal of the buffer is connected to a third terminal of the buffer, the third terminal of the buffer is connected to the read lines through the at least one switching element.

8. A display device, comprising an array substrate; wherein the array substrate comprises:
a plurality of transistors;
a plurality of pixel units, arranged in an array, and each comprising one of the transistors and a light emitting element connected to a first terminal of the one of the transistors;
selection lines, each corresponding to each row of the pixel units one to one, wherein a control terminal of each of the transistors is connected to a corresponding one of the selection lines;
read lines, each connected to a second terminal of a corresponding one of the transistors, wherein one of the transistors is connected to one of the read lines;
wherein second terminals of transistors in pixel units belonging to a same column are connected to at least two of the read lines, so that a part of the pixel units are connected to one of the at least two of the read lines, and another part of the pixel units are connected to the other one of the at least two of the read lines;
wherein the array substrate further comprises:
a reset circuit; and
readout circuits, each corresponding to a corresponding column of the pixel units one to one;
wherein for each column of the pixel units, each of the read lines is connected to one of the readout circuits corresponding to the column of the pixel units through at least one switching element; and
wherein for each column of the pixel units, each of the read lines is connected to the reset circuit through the at least one switching element,
wherein each of the readout circuits comprises an operational amplifier and a capacitor, wherein a first terminal of the operational amplifier receives a common mode signal, a second terminal of the operation amplifier is connected to a corresponding switching element, a first terminal of the capacitor is connected to a third terminal of the operational amplifier, and a second terminal of the capacitor is connected to the second terminal of the operation amplifier,
wherein the array substrate further comprises:
a data selector, configured to enable the third terminal of the operational amplifier in one of the readout circuits to be connected to a sample and hold circuit, wherein the sample and hold circuit is configured to sample a signal at the third terminal of the operational amplifier in the one of the readout circuits; and an analog-to-digital converter, connected to the sample and hold circuit and configured to convert the sampled signal at the third terminal of the operational amplifier in the one of the readout circuits into a digital signal.

9. A method for driving an array substrate, wherein the array substrate comprises:
a plurality of transistors;
a plurality of pixel units, arranged in an array, and each comprising one of the transistors and a light emitting element connected to a first terminal of the one of the transistors;
selection lines, each corresponding to each row of the pixel units one to one, wherein a control terminal of each of the transistors is connected to a corresponding one of the selection lines;
read lines, each connected to a second terminal of a corresponding one of the transistors, wherein one of the transistors is connected to one of the read lines;
wherein second terminals of transistors in pixel units belonging to a same column are connected to at least two of the read lines, so that a part of the pixel units are connected to one of the at least two of the read lines, and another part of the pixel units are connected to the other one of the at least two of the read lines;
wherein the array substrate further comprises:
a reset circuit; and
readout circuits, each corresponding to a corresponding column of the pixel units one to one;
wherein for each column of the pixel units, each of the read lines is connected to one of the readout circuits corresponding to the column of the pixel units through at least one switching element; and
wherein for each column of the pixel units, each of the read lines is connected to the reset circuit through the at least one switching element;
wherein the method comprises:
in a first stage, connecting the reset circuit to one of the at least two of the read lines connected to each column of the pixel units through the at least one switching element, and connecting a corresponding one of the readout circuits to the other one of the at least two of the read lines connected to each column of the pixel units, such that a part of the pixel units are connected to the reset circuit, another part of the pixel units are connected to the corresponding one of the readout circuits, the part of the pixel units are reset by the reset circuit, and signals of the another part of the pixel units are read by the corresponding one of the readout circuits; and
in a second stage, connecting the reset circuit to the other one of the at least two of the read lines connected to each column of the pixel units through the at least one switching element, and connecting the corresponding one of the readout circuits to the one of the at least two of the read lines connected to each column of the pixel units, such that the another part of the pixel units are connected to the reset circuit, the part of the pixel units are connected to the corresponding one of the readout circuits, the another part of the pixel units are reset by the reset circuit, and signals of the part of the pixel units are read by the corresponding one of the readout circuits.

10. The method according to claim 9, wherein second terminals of transistors in pixel units belonging to a same column are connected to two of the read lines which comprises a first read line and a second read line, such that a part of the pixel units are connected to the first read line, and another part of the pixel units are connected to the second read line;

wherein the method comprises:

in the first stage, connecting the reset circuit to the first read line connected to each column of the pixel units through the at least one switching element, and connecting the corresponding one of the readout circuits to the second read line connected to each column of the pixel units, such that a part of the pixel units are connected to the reset circuit, another part of the pixel units are connected to the corresponding one of the readout circuits, the part of the pixel units are reset by the reset circuit, and signals of the another part of the pixel units are read by the corresponding one of the readout circuits; and in the second stage, connecting the reset circuit to the second read line connected to each column of the pixel units through the at least one switching element, and connecting the corresponding one of the readout circuits to the first read line connected to each column of the pixel units, such that the another part of the pixel units are connected to the reset circuit, the part of the pixel units are connected to the corresponding one of the readout circuits, the another part of the pixel units are reset by the reset circuit, and signals of the part of the pixel units are read by the corresponding one of the readout circuits.

11. The method according to claim 10, wherein the part of the pixel units are odd rows of the pixel units belonging to the same column of the pixel units, and the another part of the pixel units are even rows of the pixel units belonging to the same column of the pixel units.

12. The method according to claim 10, wherein a part of the pixel units are first M rows of the pixel units belonging to the same column of the pixel units, and the another part of the pixel units are last P rows of the pixel units belonging to the same column of the pixel units, and M and P are integers.

* * * * *